United States Patent
Moore

(10) Patent No.: US 8,878,287 B1
(45) Date of Patent: Nov. 4, 2014

(54) SPLIT SLOT FET WITH EMBEDDED DRAIN

(75) Inventor: Paul McKay Moore, San Mateo, CA (US)

(73) Assignee: Micrel, Inc., San Jose, CA (US)

( * ) Notice: Subject to any disclaimer, the term of this patent is extended or adjusted under 35 U.S.C. 154(b) by 316 days.

(21) Appl. No.: 13/444,884

(22) Filed: Apr. 12, 2012

(51) Int. Cl.
*H01L 29/66* (2006.01)

(52) U.S. Cl.
USPC .......... 257/330; 257/329; 257/339; 438/270; 438/276

(58) Field of Classification Search
USPC .................. 257/329, 330, 339; 438/270, 276
See application file for complete search history.

(56) References Cited

U.S. PATENT DOCUMENTS

| | | | |
|---|---|---|---|
| 6,472,709 B1* | 10/2002 | Blanchard | 257/343 |
| 6,812,526 B2* | 11/2004 | Blanchard | 257/343 |
| 6,949,432 B2* | 9/2005 | Blanchard | 438/259 |
| 8,129,241 B2 | 3/2012 | Hunt | |
| 2001/0000919 A1* | 5/2001 | Kocon | 257/330 |
| 2008/0258214 A1* | 10/2008 | Jang | 257/336 |
| 2009/0095999 A1* | 4/2009 | Jang | 257/301 |
| 2009/0212357 A1* | 8/2009 | Risaki | 257/329 |
| 2010/0065904 A1 | 3/2010 | Pan et al. | |
| 2011/0284950 A1 | 11/2011 | Henson et al. | |

FOREIGN PATENT DOCUMENTS

| | | |
|---|---|---|
| WO | 2011/031563 A2 | 3/2011 |
| WO | 2011/031565 A2 | 3/2011 |

* cited by examiner

*Primary Examiner* — Jarrett Stark
(74) *Attorney, Agent, or Firm* — Van Pelt, Yi & James LLP

(57) ABSTRACT

The present invention provides an FET which includes an epitaxial layer and first and second body regions formed over the epitaxial layer. Further, the FET includes a first trench formed in the epitaxial layer between the first and the second body regions. The FET also includes a conductive layer formed on the sidewall of the first trench. The conductive layer acts as gate of the FET. The FET also includes a second trench formed at the bottom of the first trench, a first dielectric layer formed over the conductive layer and on the sidewall of the second trench, and a second dielectric layer formed on the first dielectric layer. Further, the FET includes a conductive layer, which acts as drain, deposited in the first and the second trenches. The FET also includes first and a second source regions formed in the first and second body regions, respectively.

22 Claims, 17 Drawing Sheets

SPLIT SLOT FET WITH EMBEDDED DRAIN

FIELD OF THE INVENTION

The present invention relates, in general, to field effect transistors (FETs) and, more specifically, to a split slot FET with embedded drain.

BACKGROUND

In the present age of high-speed computing and portable electronic devices, efforts are continuously made to reduce the size of devices without compromising on their computing speed. One of the preferred ways to achieve a reduction in the size is by reducing the size of transistors used in such devices.

Most of the electronic devices manufactured nowadays use metal oxide semiconductor field effect transistors (MOSFETs). MOSFETs (n-type or p-type) include a source region, a drain region, and a gate. Whenever voltage is applied across the source and drain regions and to the gate of the MOSFET, electrons flow from the source region to the drain region, resulting in the flow of current from the drain region to the source region.

In a typical MOSFET, the source region, the drain region, and the gate are laterally placed. In other words, the drain region is laterally adjacent to the gate of the MOSFET and the gate is laterally adjacent to the source region. This structure of the MOSFET has been in use for a number of years now. However, due to its lateral structure, it becomes challenging to reduce its size beyond a certain limit. Also, decreasing the size beyond a particular point often affects the performance of transistors, and hence the electronic device using them.

In light of the above observation, it is desirable to provide a transistor which is compact without reducing performance.

SUMMARY OF THE INVENTION

According to an embodiment of the present invention, a field effect transistor (FET) is provided. The FET includes an epitaxial layer of n-type conductivity formed over an n-type buried layer. The FET further includes a first body region and a second body region formed over the n-type epitaxial layer. Both the body regions are of p-type conductivity. The FET also includes a first trench formed in the epitaxial layer and between the first body region and the second body region.

The FET includes a pair of conductive layers made up of a conductive material, for example, poly silicon, formed on the sidewalls of the first trench. The pair of conductive layers acts as the FET's gate. The FET also includes a second trench, which is formed at the bottom of the first trench.

The FET includes a pair of oxide layers formed over the pair of conductive layers and a pair of nitride layers formed over the pair of oxide layers. It also includes a conductive layer made up of a conductive material, for example poly silicon, deposited in the first trench and the second trench. Additionally, the FET includes a first source region formed in the first body region and a second source region formed in the second body region. Both source regions are of n-type conductivity.

According to another embodiment of the present invention, a method for fabricating an FET device is provided. The method includes forming a first body region and a second body region in an epitaxial layer of n-type conductivity. Both the body regions are of p-type conductivity. The method further includes forming a first trench in the epitaxial layer between the first body region and the second body region and depositing a pair of conductive layers of a conductive material on the sidewalls of the first trench. The pair of conductive layers is deposited such that a conductive layer is deposited on each sidewall of the first trench. The conductive material can be, for example, poly silicon.

The method also includes forming a second trench in the epitaxial layer between the pair of conductive layers. Further, the method includes growing an oxide layer on the first body region, the second body region, the sidewalls and the bottom of the second trench, and the pair of conductive layers. The method also includes depositing a nitride layer on the oxide layer. In accordance with an embodiment of the present invention, the nitride layer is deposited on the oxide layer only over the pair of conductive layers and the sidewalls of the second trench.

Thereafter, the method includes etching the oxide layer from the bottom of the second trench and depositing a layer of a conductive material, for example, poly silicon, in the first and the second trenches. Further, the method includes etching the oxide layer from the first body and the second body regions. Lastly, the method includes forming a first source region in the first body region and a second source region in the second body region. Both the source regions are of n-type conductivity.

An objective of the present invention is to provide an FET in which the flow of electrons is vertical instead of lateral as present in conventional FETs. To achieve this objective, the channel region is rotated 90 degrees in a slot, and thus the electron flow becomes vertical. Since the channel region is vertical and not lateral, the surface area of the FET is reduced considerably.

Another objective of the present invention is to provide an FET in which a poly-silicon drain of the FET is self aligned with the gate. In addition to that, the FET has a vertical structure so it is able to handle higher voltage values without the need of lateral expansion of the device.

Another objective of the present invention is to provide a method for fabricating the FET mentioned above.

BRIEF DESCRIPTION OF THE DRAWINGS

The preferred embodiments of the invention will, hereinafter, be described in conjunction with the appended drawings provided to illustrate, but not to limit, the invention, wherein like designations denote like elements, and in which.

DETAILED DESCRIPTION OF THE INVENTION

Figure 1:
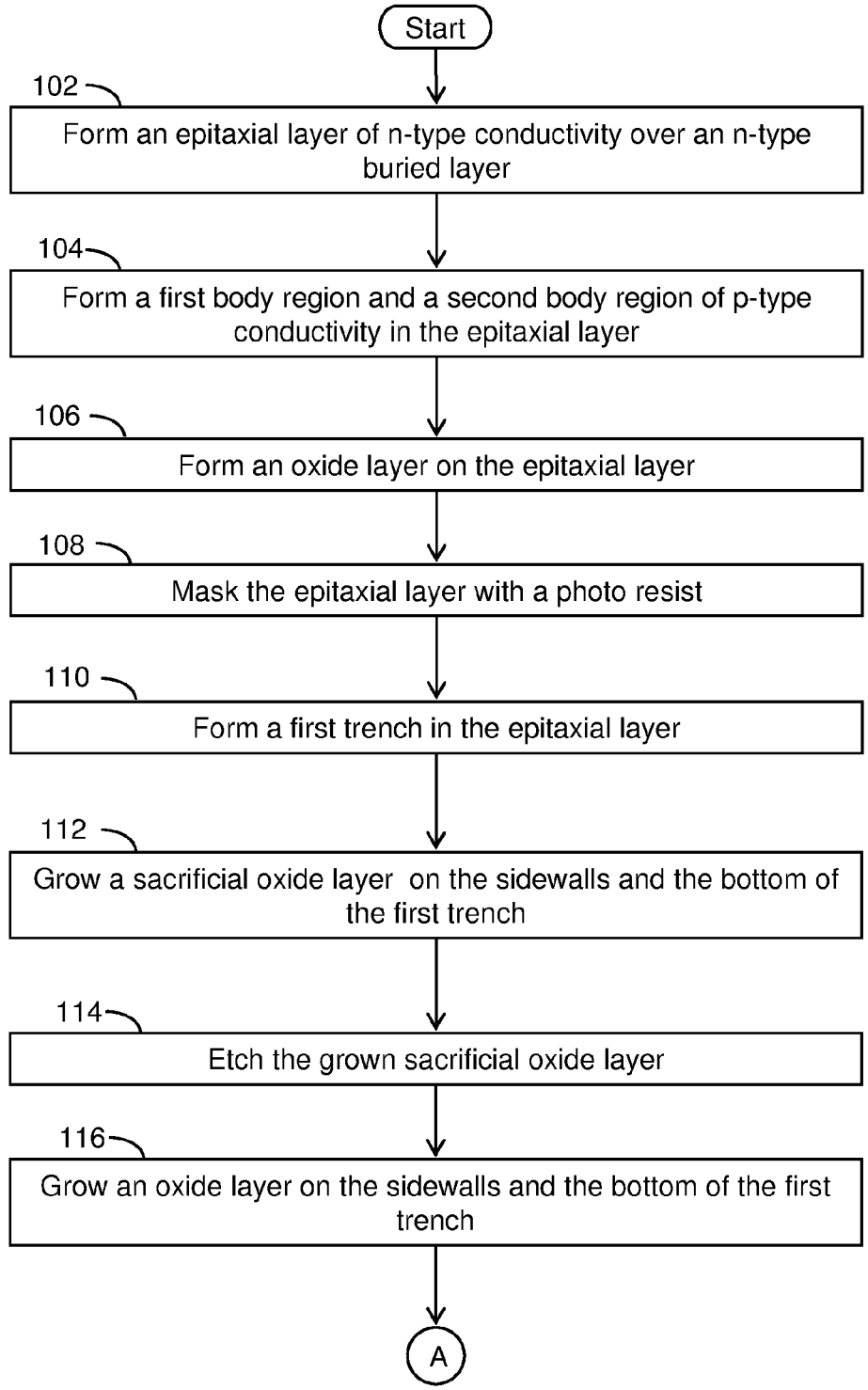
FIGS. 1-3 are flowcharts illustrating a method for fabricating a field effect transistor (FET), in accordance with an embodiment of the present invention.
Figure 2:
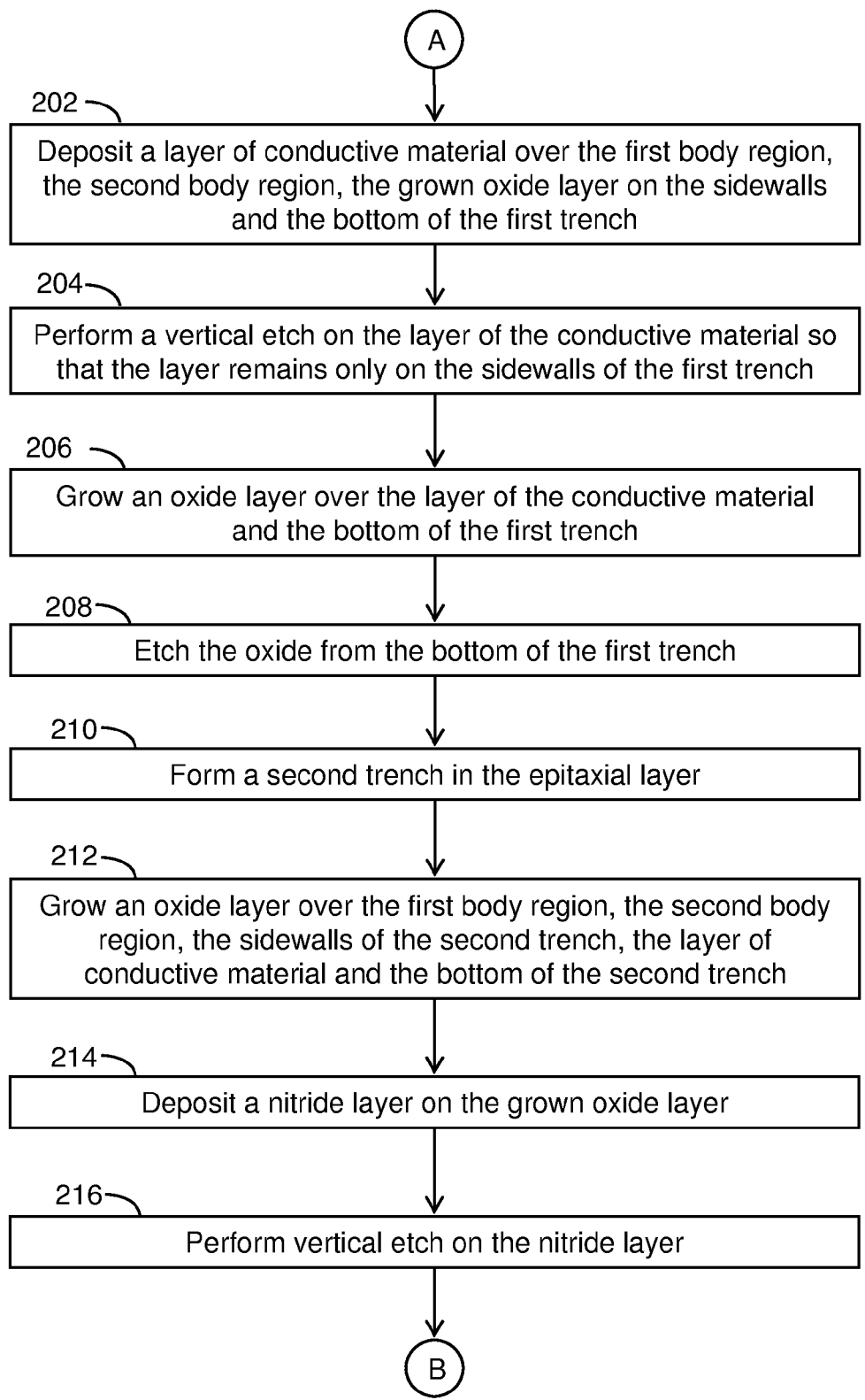
Figure 3:
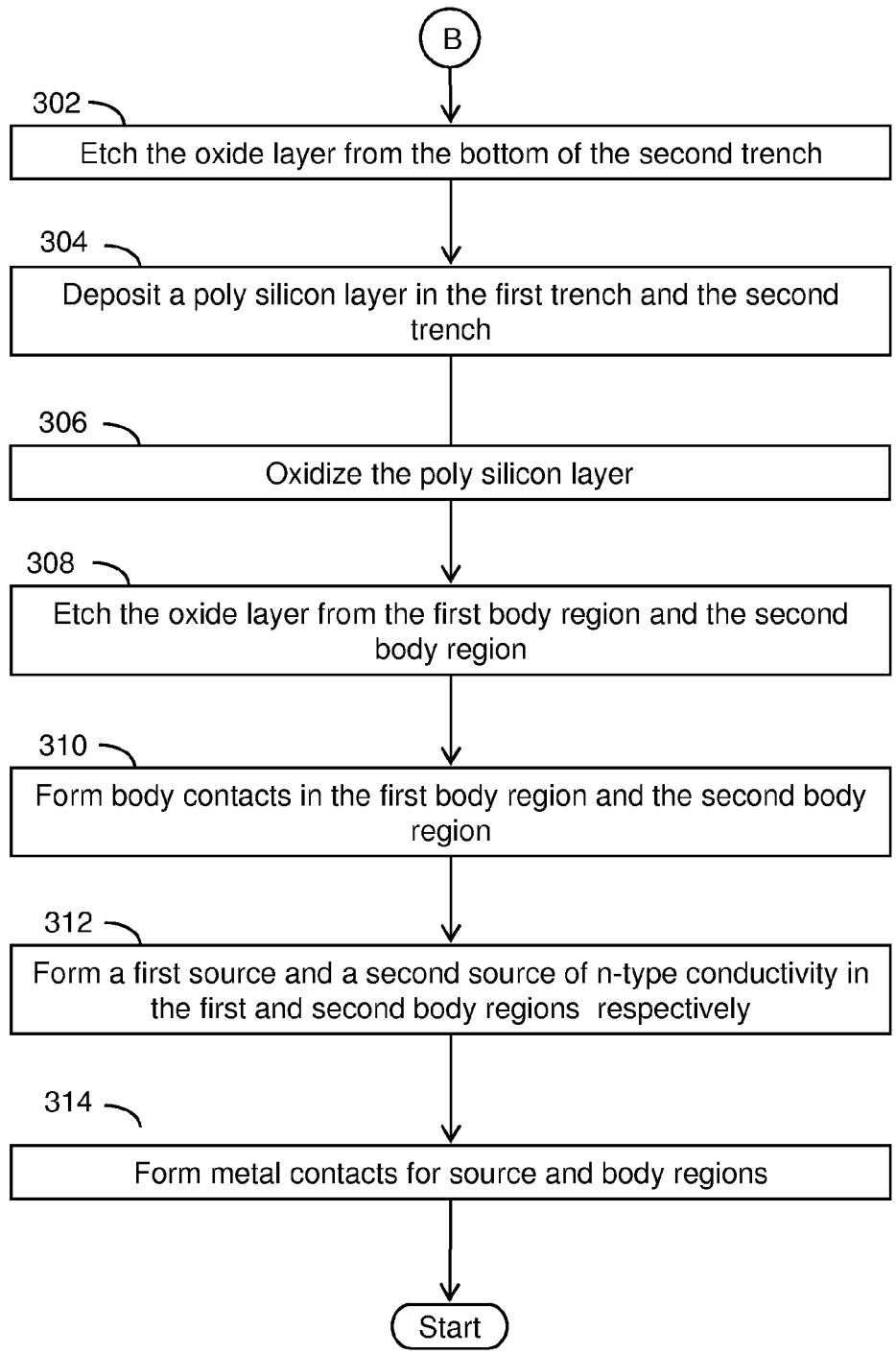

FIGS. 1-3 are flowcharts illustrating a method for fabricating a field effect transistor (FET), in accordance with an embodiment of the present invention. While describing FIGS. 1-3, references will be made to FIGS. 4-29 to illustrate different steps in the formation of the FET.

Note that the present invention is described in the context of an NMOS. However, those ordinarily skilled in the art will appreciate that the same structure of the FET can also be prepared for a PMOS. In the case of a PMOS, the conductivity type of all the layers mentioned below will be opposite to those of an NMOS.

At step 102, an epitaxial layer of n-type conductivity is formed over an n-type buried layer. In accordance with an embodiment of the present invention, the epitaxial layer's doping concentration is in the range of $10^{14}$-$10^{16}$/cm$^3$ and its thickness is in the range of 3-100 μm. In another embodiment of the present invention, the epitaxial layer's thickness is less than 3 um. Also, the doping concentration of the buried layer is either less than or higher than the doping concentration of the epitaxial layer. In accordance with an embodiment of the present invention, the doping concentration of the buried layer depends on the thickness of the epitaxial layer and the breakdown voltage requirements of the FET.

Figure 4:
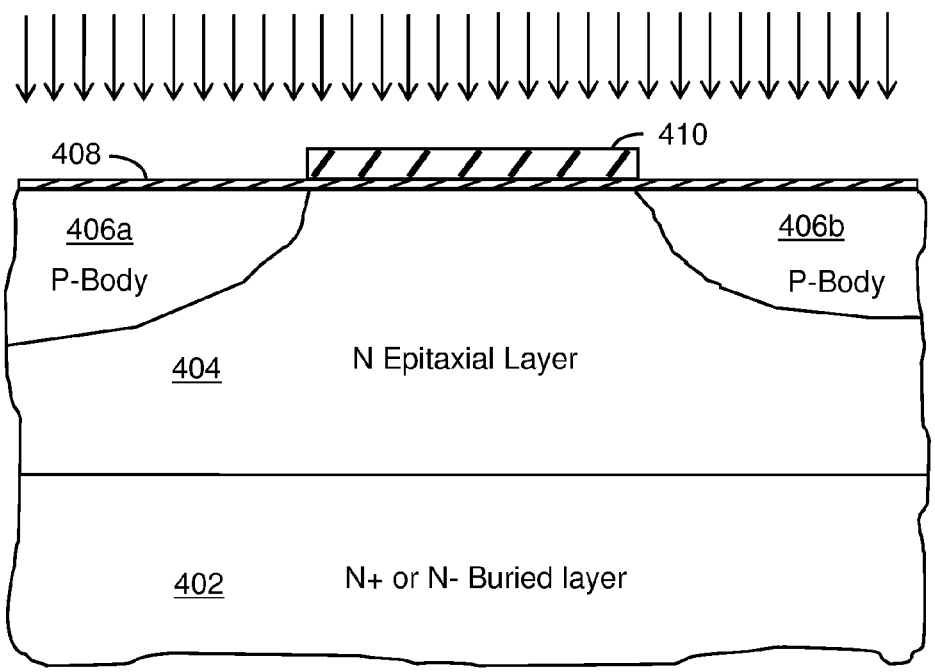
FIGS. 4-29 are cross-sectional views of a semiconductor structure during various stages of fabrication, in accordance with various embodiments of the present invention.

At step 104, a first body region and a second body region of p-type conductivity are formed in the epitaxial layer. The first and second body regions formed during step 104 are shown in FIG. 4. As shown in FIG. 4, the semiconductor structure includes an epitaxial layer 404 formed over a buried layer 402 as described at step 102. Also shown in FIG. 4 is a photoresist 410 provided over a thin oxide layer 408. In accordance with an embodiment of the present invention, the thickness of oxide layer 408 is 350 Å. Photoresist 410 is provided to mask the region on the semiconductor structure where body regions are not formed, for example, in the region of epitaxial layer 404 between the first and the second body regions.

The process of ion implantation for the formation of the first body region 406a and the second body region 406b is shown in FIG. 4. In accordance with an embodiment of the present invention, for this ion implantation, boron is used as an implant and the dose is $3 \times 10^{14}$/cm$^2$. Also, the energy of implantation is 140 KeV.

Those ordinarily skilled in the art will know that the body regions 406a and 406b can also be formed in an n-type well (not shown in the figures) instead of epitaxial layer 404.

Figure 5:
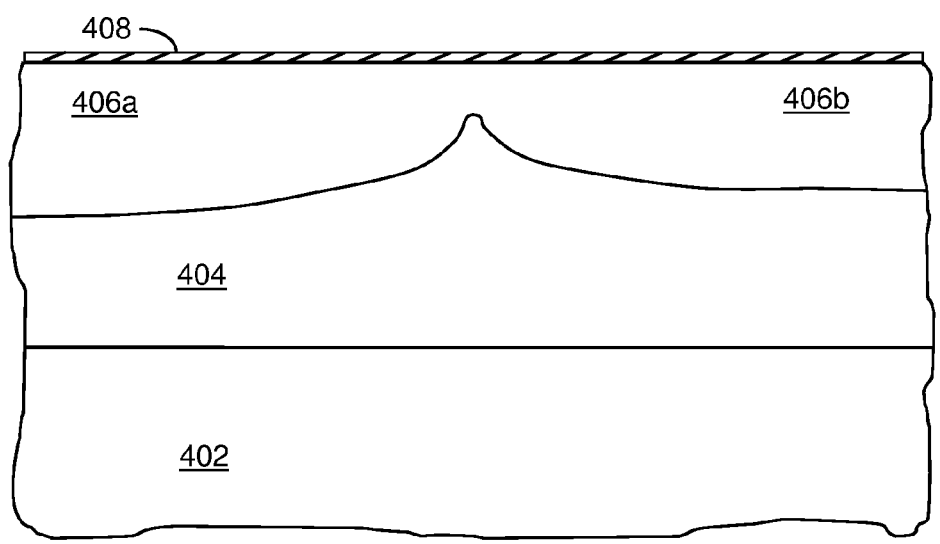

After step 104 is performed and after the photoresist is removed, the semiconductor structure of FIG. 4 is kept at the temperature of 1100° C. for 120 minutes. Those ordinarily skilled in the art will know that the structure is kept at the temperature of 1100° C. for 120 minutes to "spread" the p-type dopant used for the formation of first and second body regions 406a and 406b. The structure formed after the semiconductor structure is kept at the temperature of 1100° C., is shown in FIG. 5. As shown, body regions 406a and 406b are spread laterally and vertically after this step.

Figure 6:
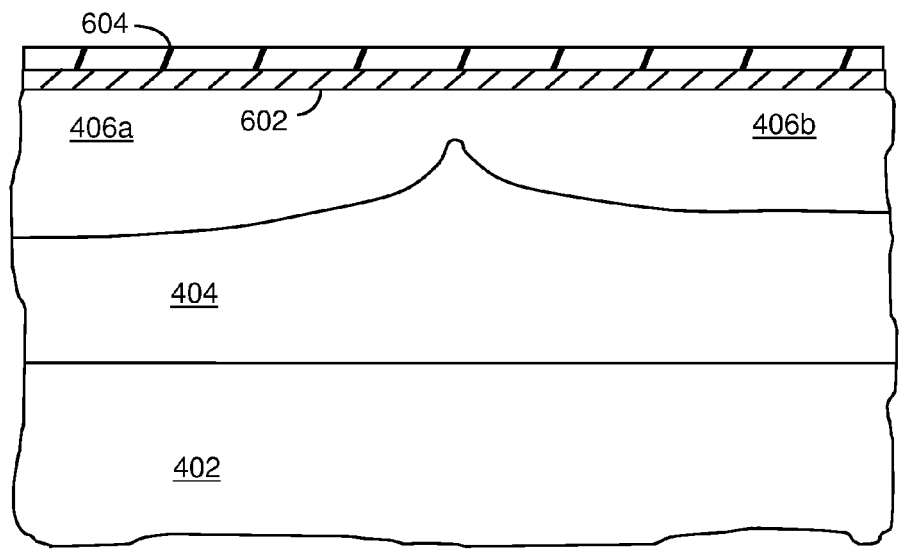

At step 106, an oxide layer is formed over epitaxial layer 404. The oxide layer is deposited on oxide layer 408, which is already present on epitaxial layer 404. In accordance with an embodiment of the present invention, the thickness of oxide layer deposited on the epitaxial layer at step 106 ranges from 1500 Å to 5KÅ. At step 108, epitaxial layer 404 is masked using a photo resist. The semiconductor structure formed after step 108 is shown in FIG. 6. As shown, oxide layer 602, previously mentioned, is formed over epitaxial layer 404, and then a mask 604 is provided over epitaxial layer 404 to protect it during a subsequent step of forming a trench in epitaxial layer 404.

Figure 7:
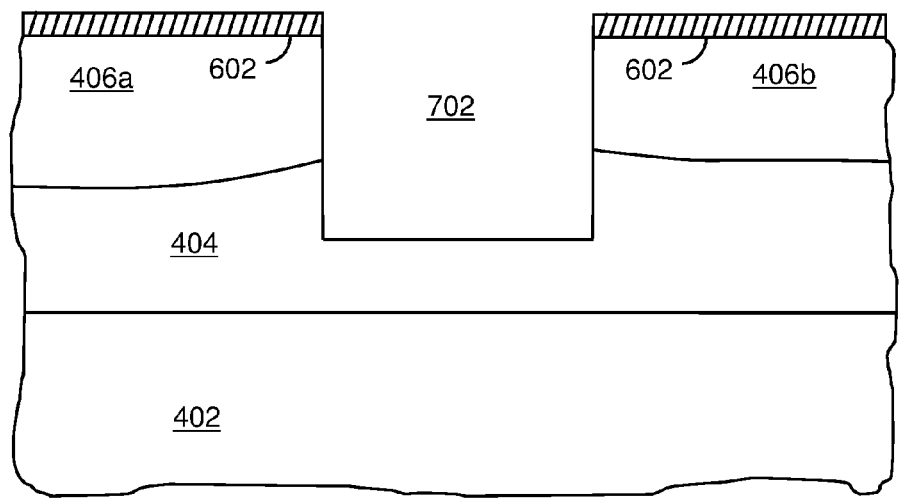

At step 110, a first trench 702 is formed in epitaxial layer 404. Prior to formation of first trench 702, the photo resist mask 604 is removed from a portion of epitaxial layer 404 present between the two body regions 406a and 406b. First trench 702 is shown in FIG. 7. As apparent from the figure, first trench 702 is formed in epitaxial layer 404 between the two body regions 406a and 406b. In accordance with an embodiment of the present invention, the depth of first trench 702 ranges from 0.5 μm to 2 μm. Those ordinarily skilled in the art will know that the depth of first trench 702 depends upon the selectivity of the etchants used for forming first trench 702.

In accordance with another embodiment of the present invention, only a single body region is formed over epitaxial layer 404, instead of two separate body regions 406a and 406b. However, with the formation of first trench 702, the single body region itself gets divided into two body regions.

At step 112, a sacrificial oxide layer is grown on the sidewalls and the bottom of first trench 702. In accordance with an embodiment of the present invention, the thickness of the sacrificial oxide layer is approximately 200 Å. At step 114, the grown sacrificial oxide layer is etched. Those ordinarily skilled in the art will know that the growth and the etching of sacrificial oxide layer ensure that the surface of first trench 702 is smooth and it improves the integrity of the gate oxide layer, which is grown afterwards on the sidewalls of first trench 702.

Figure 8:
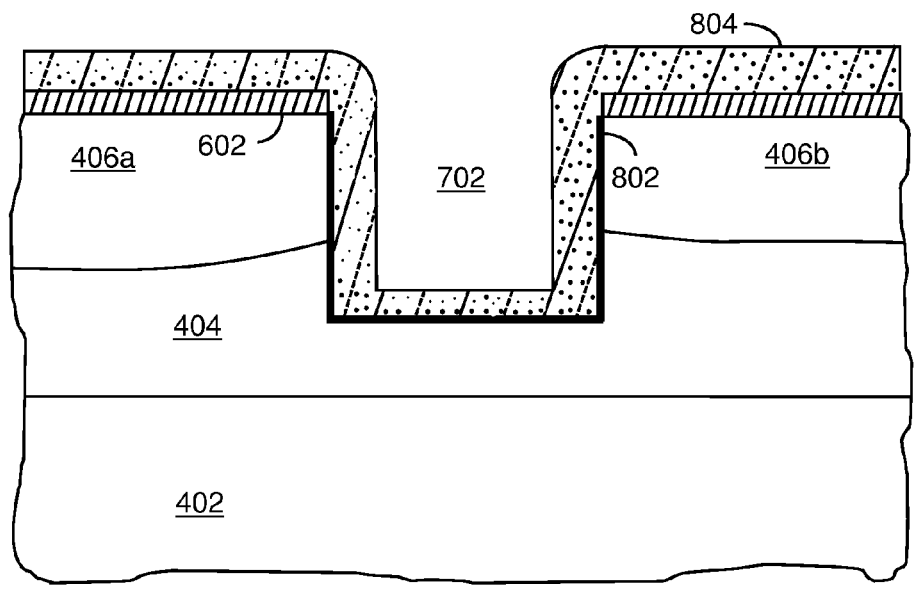

At step 116, a thin oxide layer is grown on the sidewalls and the bottom of first trench 702. The thin oxide layer acts as the gate oxide layer of the FET. After the formation of this layer, at step 202, a layer of conductive material is deposited over p-body regions 406a and 406b and the thin oxide layer. The semiconductor structure formed after steps 116 and 202 is shown in FIG. 8. As shown, thin oxide layer 802 is formed over the sidewalls and the bottom of first trench 702, and a layer of conductive material, for example, a poly silicon layer 804, is formed over thin oxide layer 802 and p-body regions 406a and 406b. In accordance with an embodiment of the present invention, the thickness of the poly silicon layer 804 is 3000 Å, and the poly silicon layer is doped with n-type conductivity after it is deposited at step 202. After the process of doping poly silicon layer 804 with n-type conductivity, poly silicon region 804 is vertically etched to create a conductive spacer, which will act as the gate.

Figure 9:
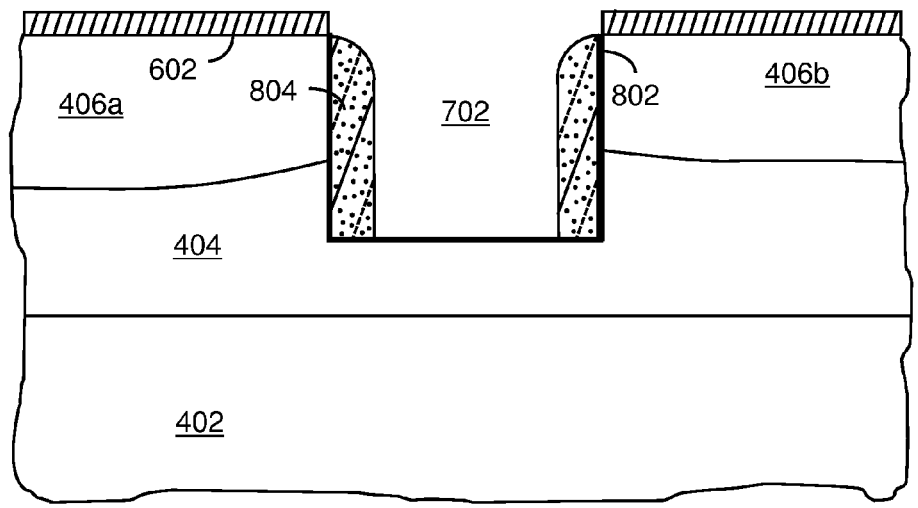
Figure 10A:
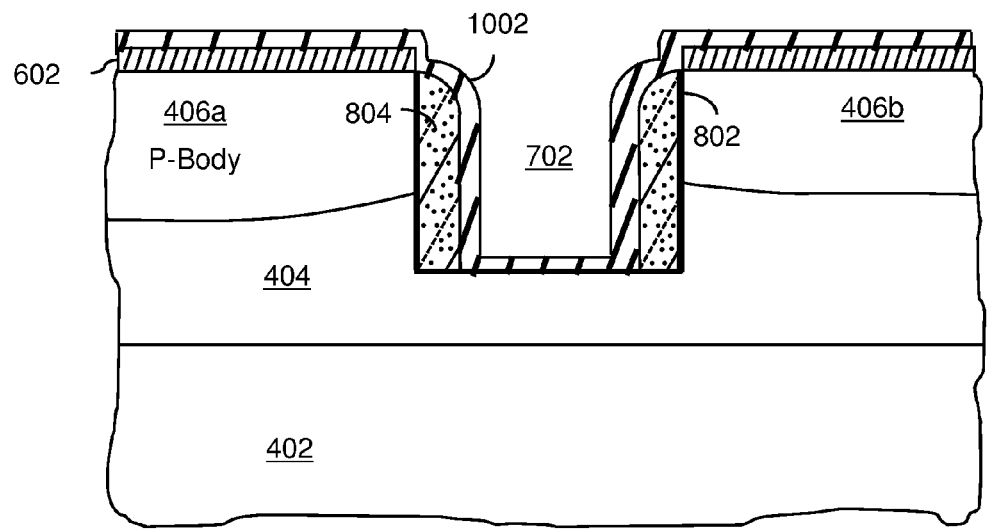
Figure 10B:
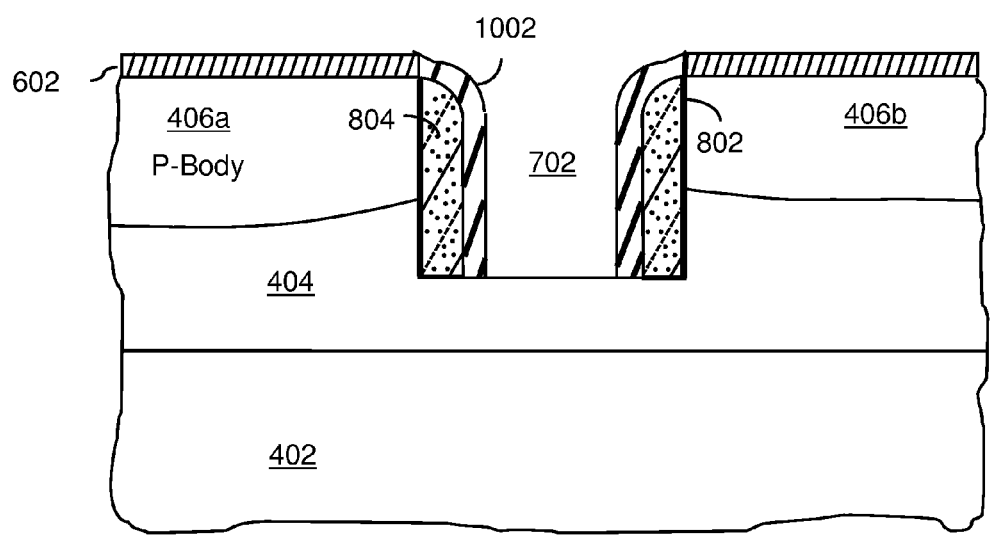
Figure 11:
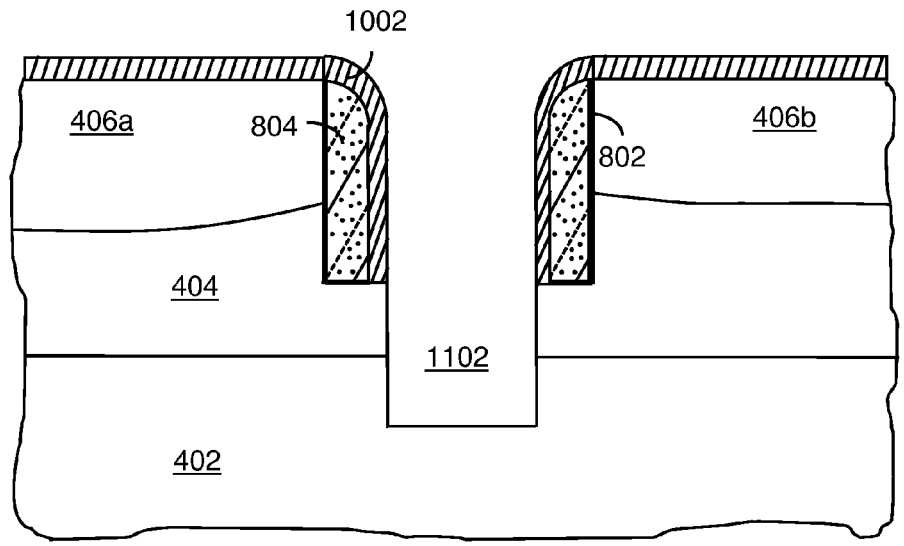

At step 204, a vertical etch is performed on poly silicon layer 804, so that the layer remains only on the sidewalls on first trench 702. The resulting semiconductor structure is shown in FIG. 9. As shown in the figure, poly silicon layer 804 remains only on the sidewalls of first trench 702. At step 206, an oxide layer 1002 is grown over the entire first trench 702 and over two p-body regions 406a and 406b as shown in FIG. 10a. Thereafter, at step 208 oxide layer 1002 vertically etched to reveal silicon in the bottom of trench 702. The resulting semiconductor structure is shown in FIG. 10b. At step 210, a second trench is formed in epitaxial layer 404. As shown in FIG. 11, second trench 1102 is formed at the bottom of first trench 702, and it may be partially present in buried layer 402 in addition to epitaxial layer 404. In accordance with an embodiment of the present invention, the depth of second trench 1102 is 1.5 μm below first trench 702.

Figure 12:
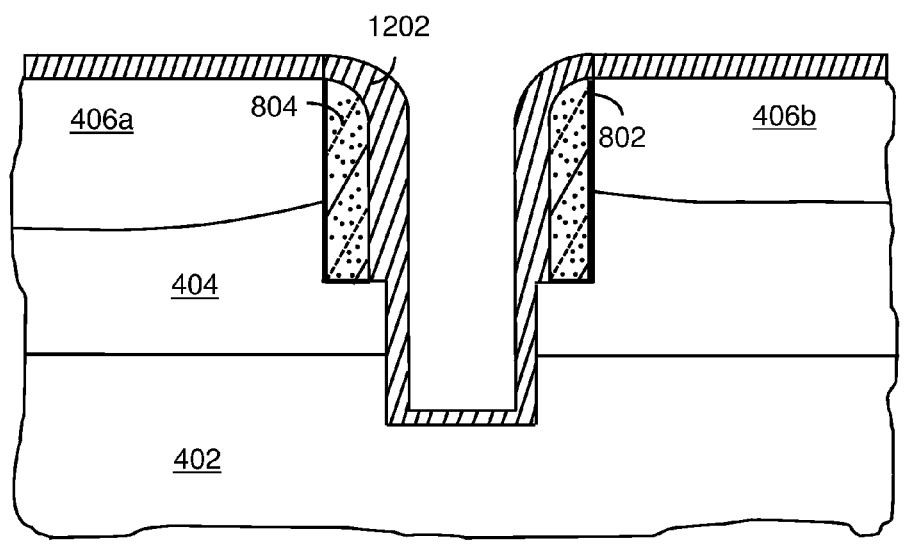
Figure 13:
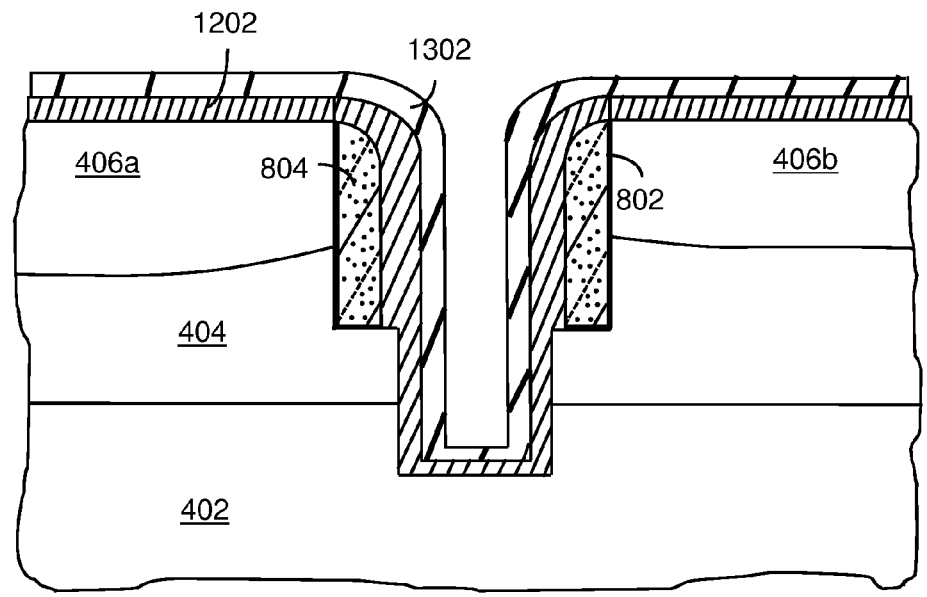

Thereafter, at step 212, an oxide layer is grown over p-body regions 406a and 406b, the sidewalls and the bottom of second trench 1102 and over poly silicon layer 804. The resulting semiconductor structure is shown in FIG. 12, where an oxide layer 1202 is grown over the regions mentioned above. At step 214, a nitride layer 1302 is deposited on oxide layer 1202 (as shown in FIG. 13). In accordance with an embodiment of the present invention, the thickness of the deposited nitride layer 1302 is 1800 Å.

Figure 14:
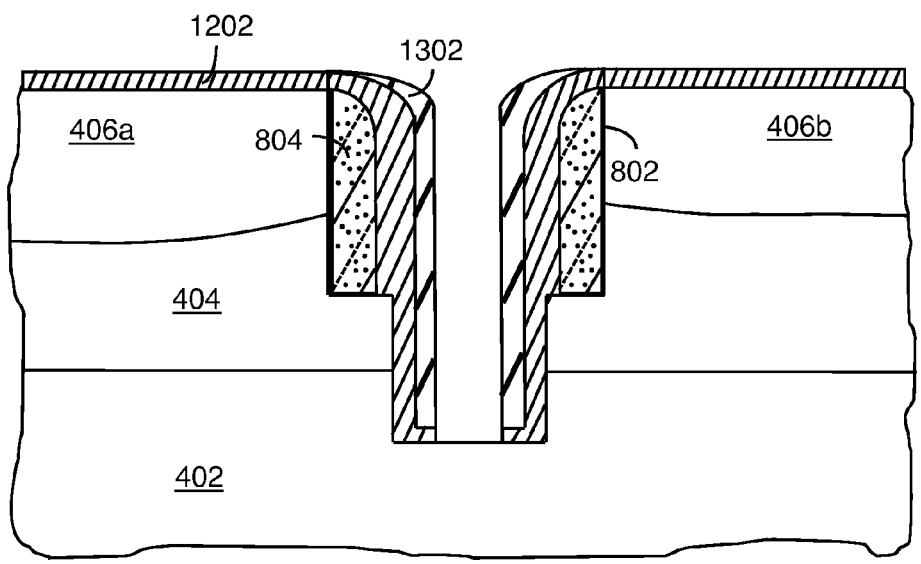

Thereafter, at step 216, a vertical etch is performed on nitride layer 1302. It is performed for a thickness of 2000 Å. After the nitride vertical etch, at step 302, another vertical etch is performed for oxide layer 1202 to remove oxide layer 1202 from the bottom of second trench 1102. In accordance with an embodiment of the present invention, the vertical etch for oxide layer 1202 is performed for a thickness of 900 Å. As shown in FIG. 14, after the vertical etch, only oxide layer 1202 remains over p-body regions 406a and 406b, and a portion of the bottom of second trench 1102 does not have oxide layer 1202 and nitride layer 1302.

Figure 15:
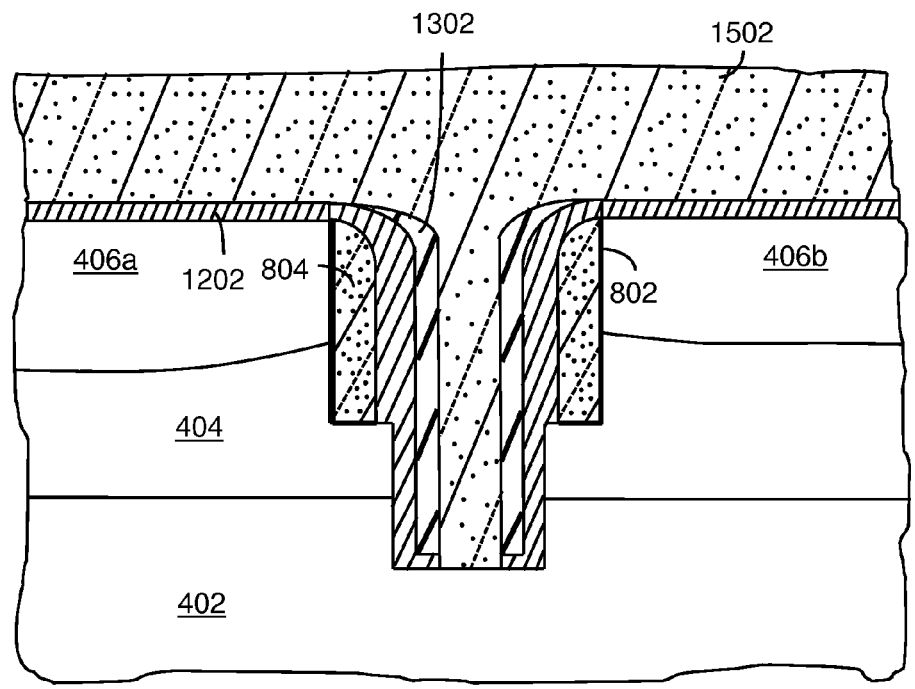
Figure 16:
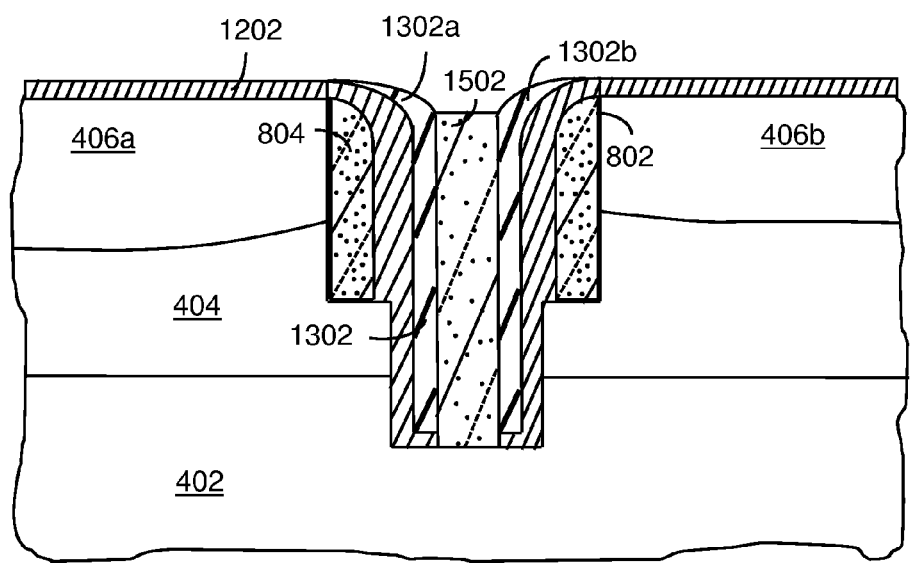
Figure 17:
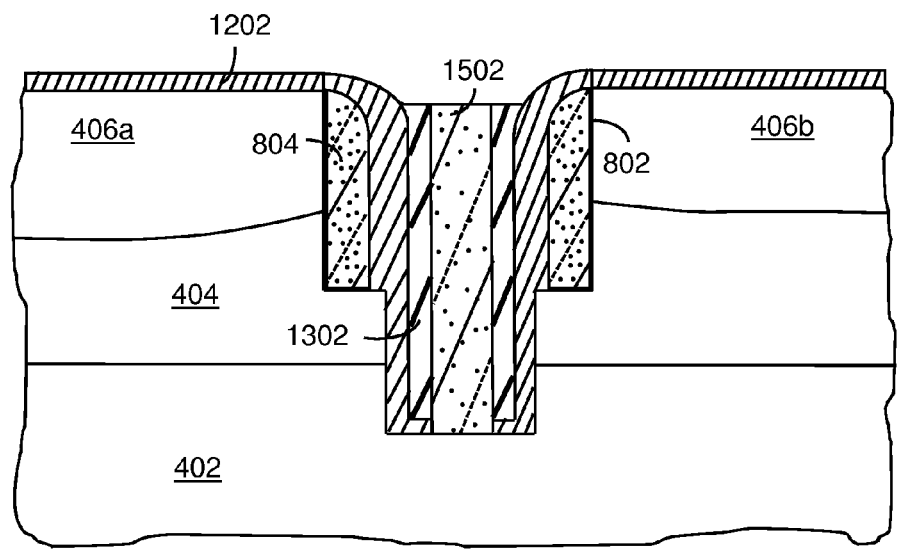

At step 304, a poly silicon layer 1502 is deposited in the first and the second trench 702 and 1102. In accordance with an embodiment of the present invention, the poly silicon layer is first deposited in first trench 702, second trench 1102, and over p-body regions 406a and 406b, as shown in FIG. 15. The thickness of deposited poly silicon layer 1502 is 1.2 μm above the level of oxide layer 1202. After the deposition of poly silicon layer 1502, the layer is etched 1.3 μm resulting in a structure shown in FIG. 16. Once the structure shown in FIG. 16 is made, nitride layers on the top of the first trench, shown as elements 1302a and 1302b, are etched. The resulting semiconductor structure is shown in FIG. 17.

Figure 18:
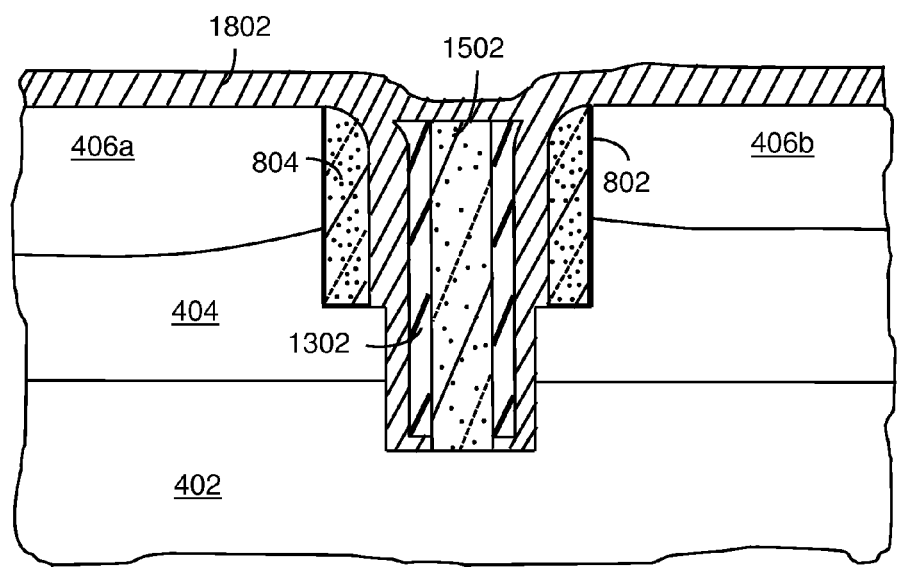
Figure 19:
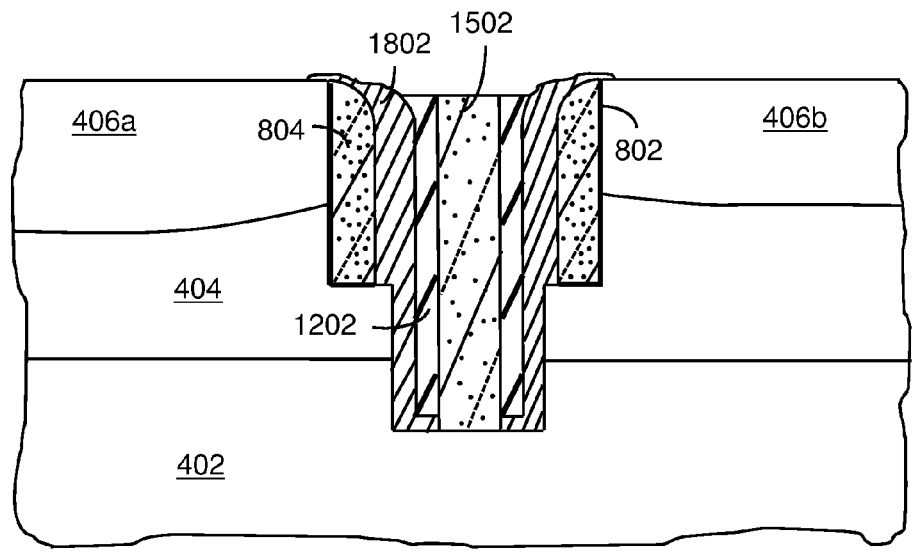

At step 306, poly silicon layer 1502 is oxidized and the resulting structure is shown in FIG. 18. As shown, after step 306, a single oxide layer 1802 exists over p-body regions 406a and 406b, and between poly silicon layer 804 and nitride layer 1302. At step 308, oxide layer 1802 is etched from the top of p-body regions 406a and 406b and top surface of nitride layer 1302 and poly silicon layer 1502, and the resulting semiconductor structure is shown in FIG. 19.

Figure 20:
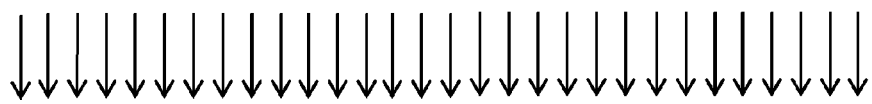
Figure 20:
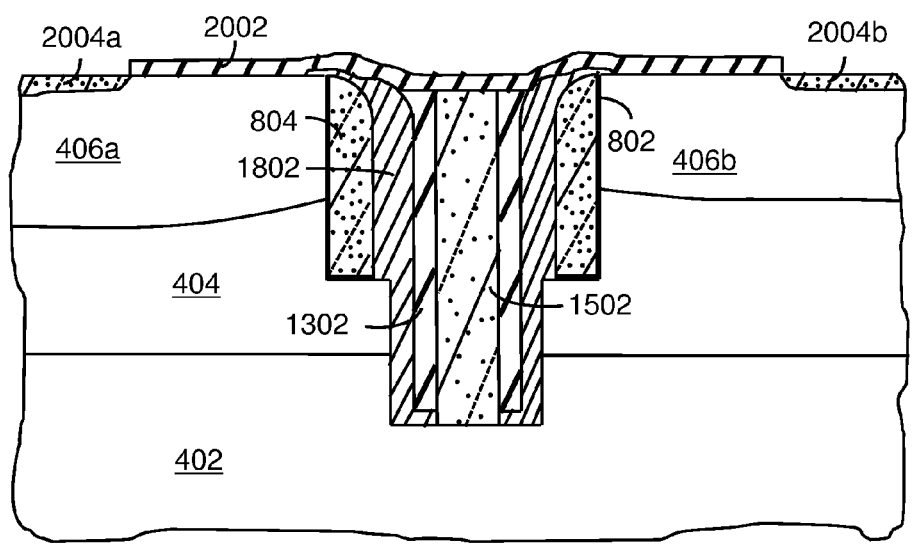
Figure 21:
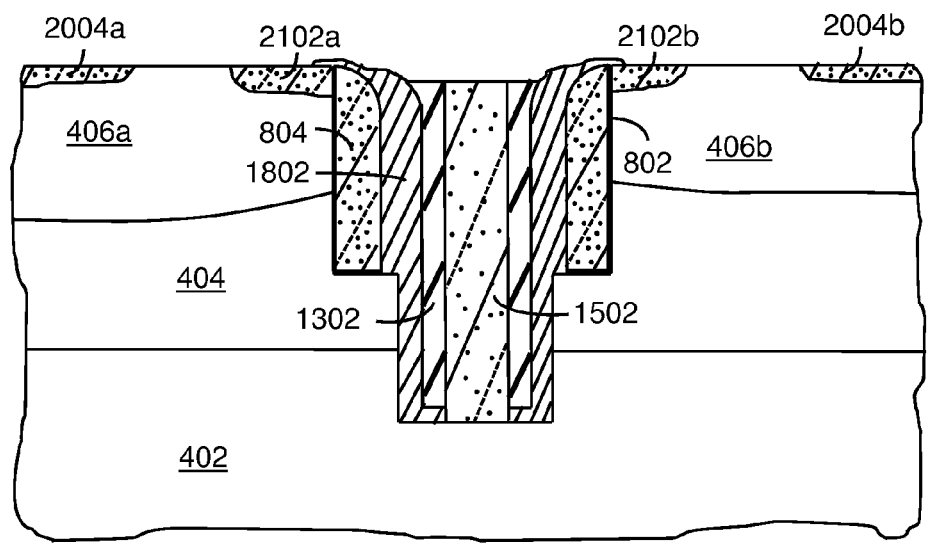

Thereafter, at step 310, body contacts 2004a and 2004b are formed in p-body regions 406a and 406b. As shown in FIG. 20, a mask 2002 is first provided over the regions where body contacts are not required and then p+ implantation is performed. In accordance with an embodiment of the present invention, boron difluoride (BF2) implantation is performed for the formation of body contacts 2004a and 2004b and the implant dose is $3 \times 10^{15}/cm^2$. Also, the energy of implantation is 50 keV. After the implantation, at step 312, a first source 2102a and a second source 2102b are formed in p-body regions 406a and 406b, respectively. The resulting semiconductor structure is shown in FIG. 21. In accordance with an embodiment of the present invention, arsenic is used for n-type implantation for the formation of sources 2102a and 2102b and the implant dose is $3 \times 10^{15}/cm^2$. Also, the energy of implantation is 85 keV. Those ordinarily skilled in the art will appreciate that for the formation of sources 2102a and 2102b, a mask is first provided over the regions where the source regions are not required and then removed after the sources are formed. For the sake of simplicity, the mask used for the formation of sources 2102a and 2102b is not shown in FIG. 21.

Figure 22:
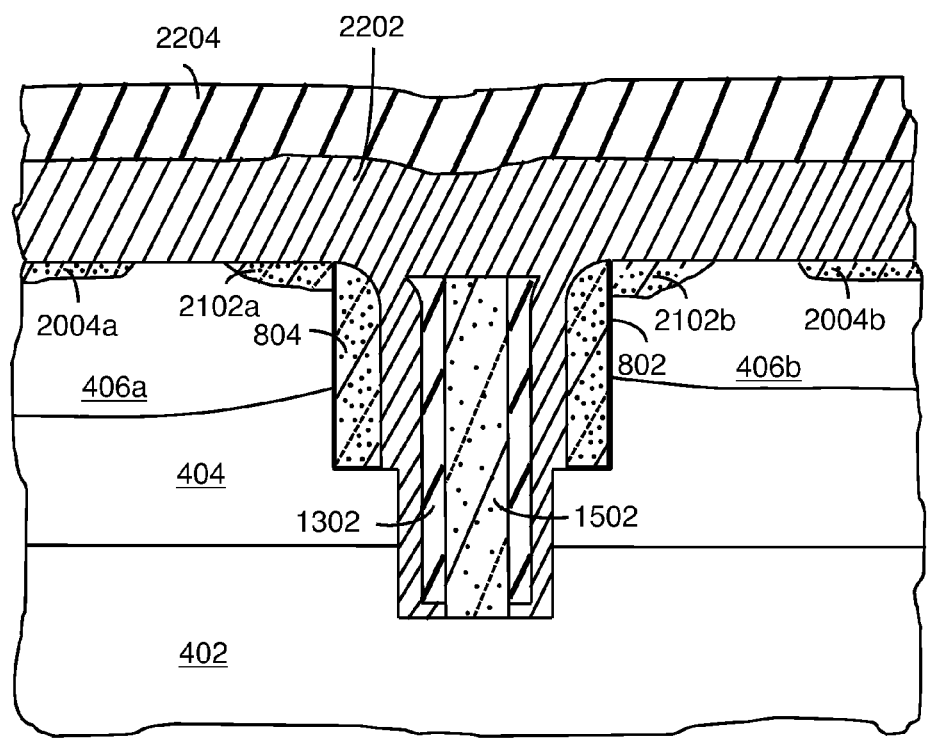
Figure 23:
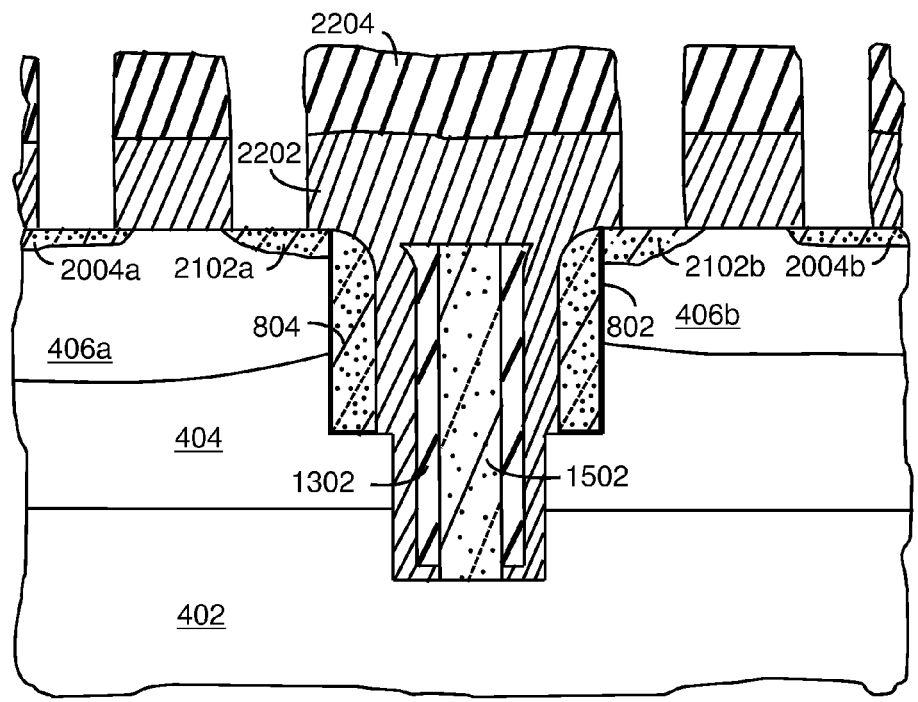

After step 312, low-temperature oxide (LTO) deposition is performed over the entire semiconductor structure, followed by borophosphosilicate glass (BPSG) deposition. In accordance with an embodiment of the present invention, 1000 Å of LTO and 1 μm of BPSG are deposited over the semiconductor structure. After these depositions, BPSG flow process takes place at 900 F temperature, with 1% oxygen environment for 30 minutes (F900-1% O2-30 min). Thereafter, a mask is provided over the entire semiconductor structure. The resulting structure is shown in FIG. 22. As shown, a single layer of oxide and BPSG 2202 is formed over the entire semiconductor structure, and a mask 2204 is provided over it. After this, etching is performed in the regions where metal contacts for body and source regions are to be made. The resulting structure is shown in FIG. 23. As apparent from the figure, etching is performed in those regions which contain sources 2102a and 2102b and body contacts 2004a and 2004b.

Figure 24:
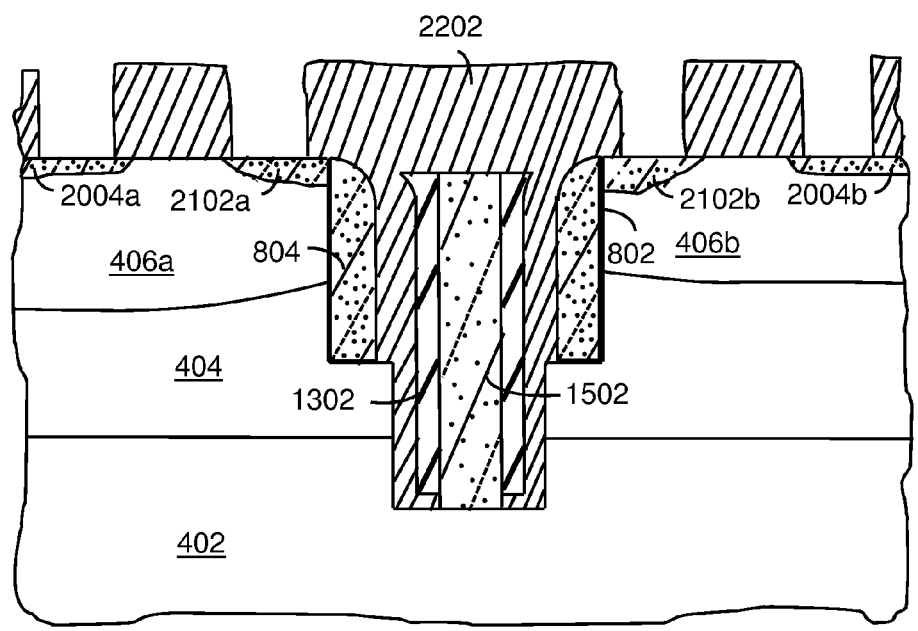
Figure 25:
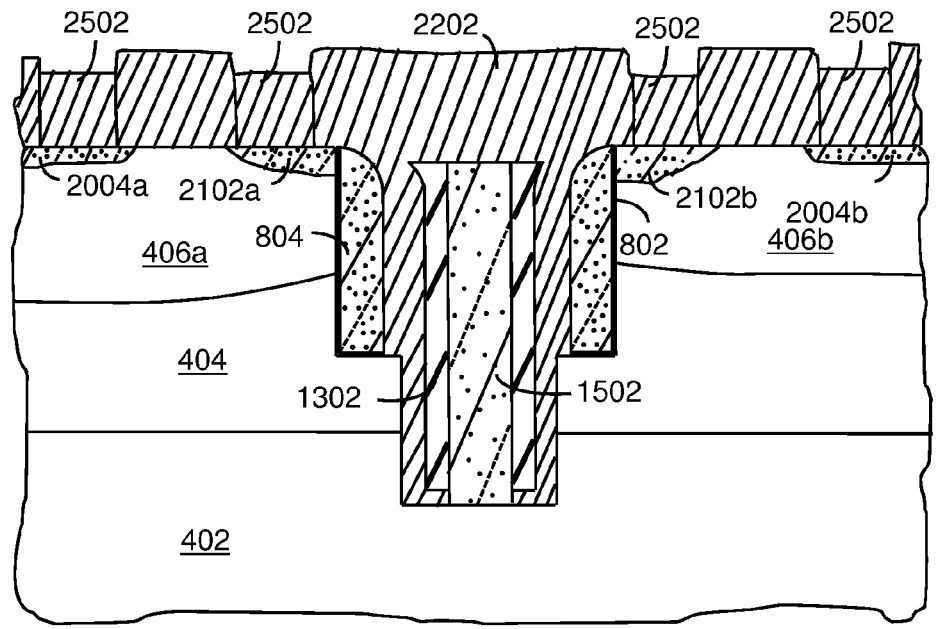
Figure 26:
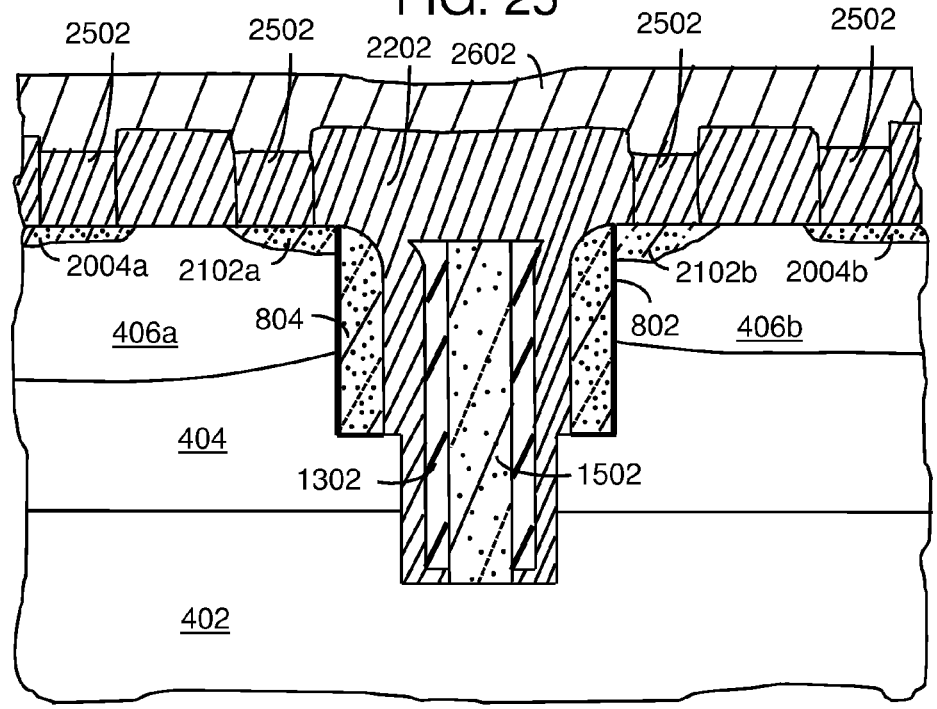
Figure 27:
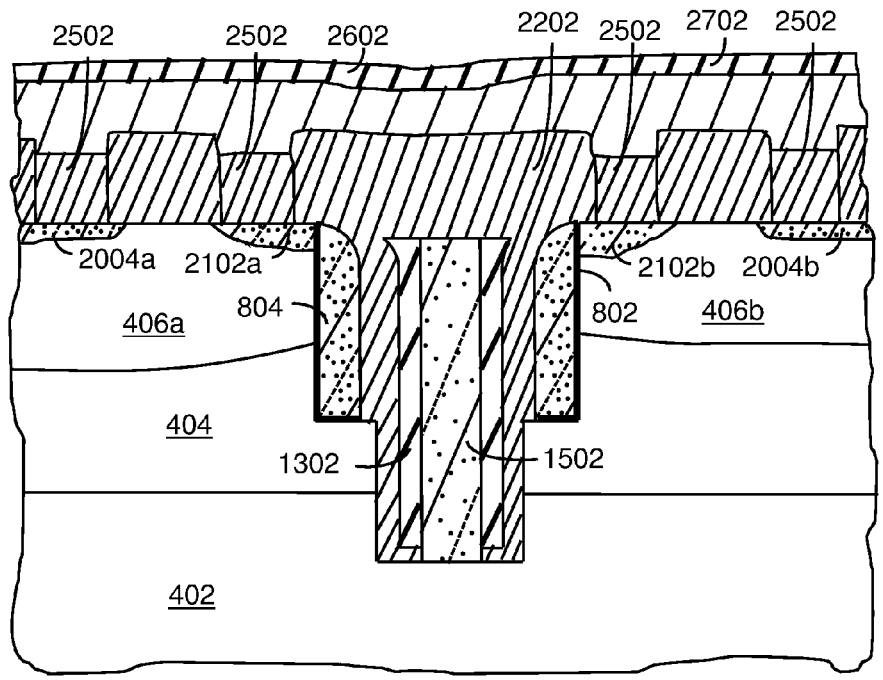

After etching is performed, mask 2204 is removed and the resulting semiconductor structure is shown in FIG. 24. After this, at step 314, metal contacts for sources 2102a and 2102b, and p-body regions 406a and 406b are formed. In accordance with an embodiment of the present invention, to perform step 314, tungsten metal is first deposited over the semiconductor structure shown in FIG. 24, and then etched to form a structure shown in FIG. 25. As shown in FIG. 25, tungsten layer 2502 is etched in such a way that it remains over sources 2102a and 2102b and body contacts 2004a and 2004b. Those ordinarily skilled in the art will know that tungsten layer 2502, can be replaced with titanium layer or titanium nitride layer. Further, a layer of aluminum 2602 is provided over the semiconductor structure as shown in FIG. 26, and then a layer 2702 of a different metal is provided over the layer of aluminum 2602, as shown in FIG. 27. Those ordinarily skilled in the art will know that the layer of aluminum 2502, can be replaced with the layer of titanium nitride. In accordance with an embodiment of the present invention, the metal for layer 2702 is 1-5 KÅ and the metal can be, for example, copper.

Figure 28:
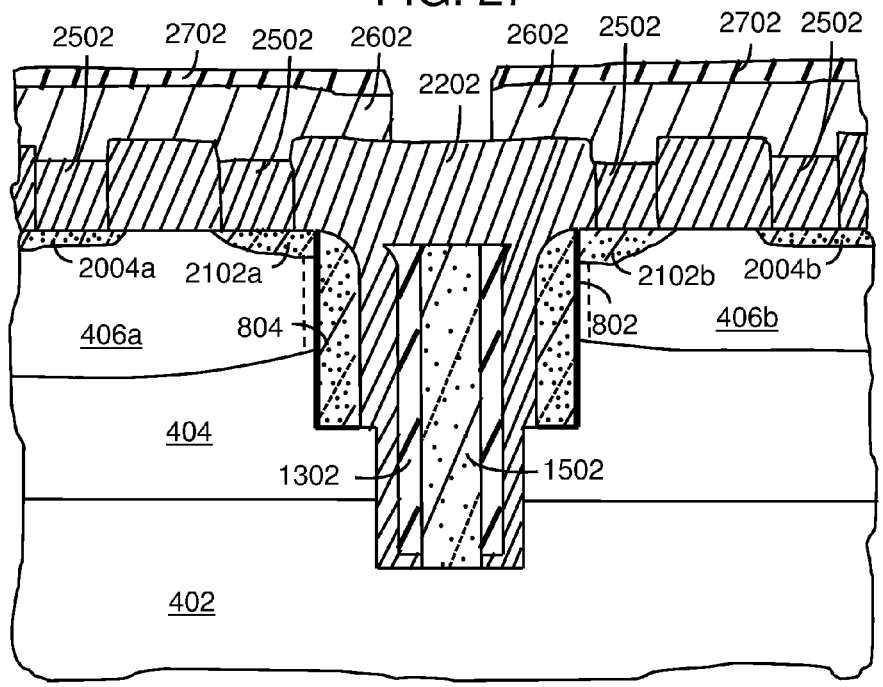

Lastly, the layer of aluminum 2602 and layer 2702 are etched from the region above poly silicon layer 1502. FIG. 28 shows the final structure of FET 2800, in accordance with an embodiment of the present invention. In FET 2800, poly silicon layer 1502 acts as n+ poly drain, poly silicon layer 804 acts as n+ poly gate, and the dotted line connecting sources 2102a and 2102b with epitaxial layer 404 depicts the channel region of FET 2800.

When a positive voltage is applied to poly silicon layer 804 and drain-to-source voltage is applied to FET 2800, electrons flow from sources 2102a and 2102b to poly silicon layer 1502, through the channel region, epitaxial layer 404, and buried layer 402. Thus, the flow of current is from poly silicon layer 1502 to sources 2102a and 2102b.

In an embodiment of the present invention, FET 2800 may include a metal or polysilicon layer between BPSG layer 2202 and nitride layer 1302. Further, such embodiment of the present invention may have oxide layer 802 extended till the depth of second trench 1102.

In another embodiment of the present invention, FET 2800 may include a single dielectric layer between poly silicon layer 1502 and poly silicon layer 804. The dielectric layer can be, but not limited to, nitride layer, BPSG layer, or any other dielectric layer.

Figure 29:
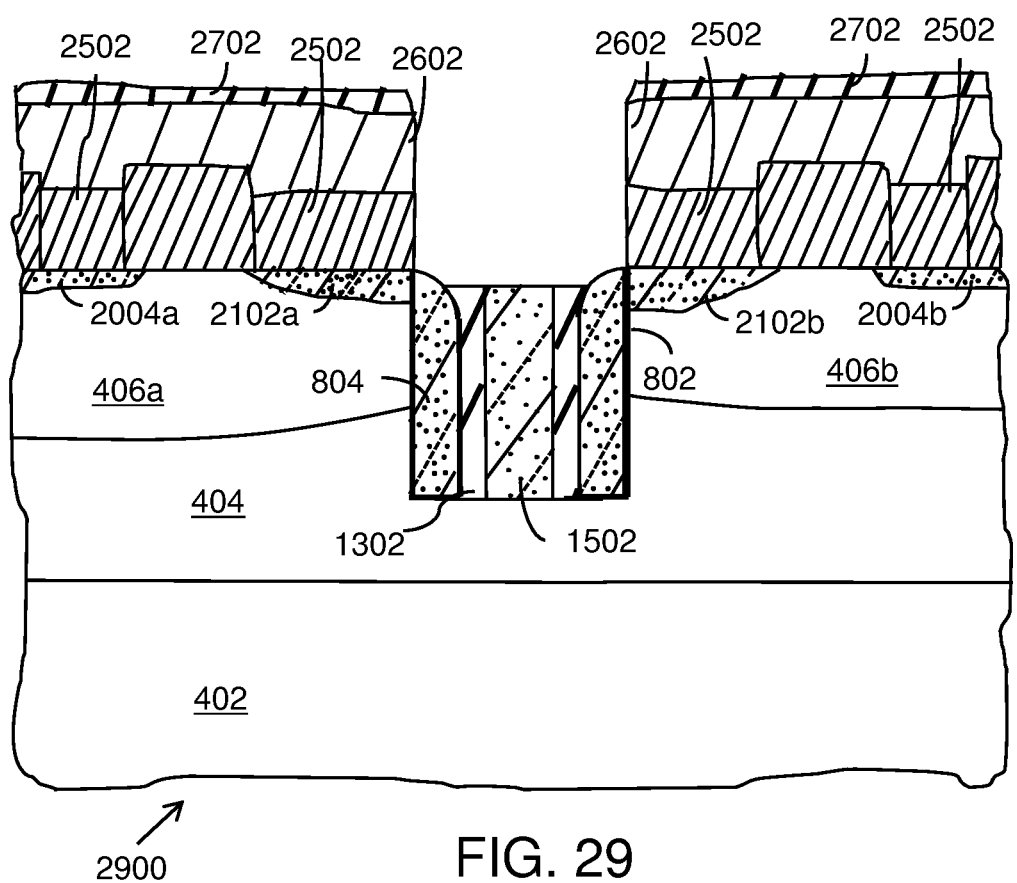

It should be known by a person skilled in the art that the above described method for fabricating FET 2800 can be realized in a single trench. The invention should not be limited to making first trench 702 and thereafter second trench 1102. FET 2800 can be fabricated in first trench 702 as depicted in FIG. 29 by FET 2900.

FET 2900 includes first trench 702. First trench 702 is etched as described in conjunction with FIG. 1. First trench 702 includes poly silicon layer 804 formed on the sidewall of first trench 702. In an embodiment, poly silicon layer 804 acts as a gate of FET 2900. Nitride layer 1302 is formed along the walls of poly silicon layer 804. Poly silicon layer 1502 is deposited along the wall of nitride layer 1302. In an embodiment poly silicon layer 1502 act as a drain terminal of the FET 2900. Further, FET 2900 includes a pair of source region 2102a and 2102b that are separated from the gate of FET 2900 by thin oxide layer 802.

Those ordinarily skilled in the art will appreciate that although the method for fabricating FET 2800 and its structure is described in accordance with an NMOS device, the same method, and similar structure is applicable for a PMOS device as well where conductivity types are opposite to those previously shown and described.

Various embodiments of the present invention provide a size advantage over conventional FETs. Specifically, the FET fabricated using the present method has a vertical channel region, which results in the reduction of FET's size. Due to this reduction, FET device's cell density is increased and more FETs can be fabricated in a small area. In this way, the size of electronic devices using the present FETs can be significantly reduced. In addition, the reduction in size is achieved without compromising on the performance of the FETs and eventually the electronic devices.

While the preferred embodiments of the invention have been illustrated and described, it will be clear that the invention is not limited to these embodiments only. Numerous modifications, changes, variations, substitutions, and equivalents will be apparent to those skilled in the art without departing from the spirit and scope of the invention, as described in the claims.

What is claimed is:

1. A field effect transistor (FET) device, comprising:
a semiconductor layer of a first conductivity type;
a first trench formed in the semiconductor layer;
a body region of a second conductivity type formed in the semiconductor layer on both sides of the first trench, the body region extending partially the depth of the first trench;
a gate dielectric layer formed on the sidewall of the first trench;
a conductive spacer formed on the sidewall of the first trench and being insulated from the semiconductor layer by the gate dielectric layer, the conductive spacer acting as the gate of the FET device;
a dielectric layer formed over the conductive spacer and insulating the conductive spacer in the first trench;
a second trench formed in the first trench over the dielectric layer and extending beyond a bottom portion of the first trench, the semiconductor layer being exposed at a bottom portion of the second trench;
a conductive layer of a semiconductor material having the first conductivity type and being heavily doped, the conductive layer filling the first trench and the second trench and being in contact with the exposed semiconductor layer at the bottom portion of the second trench, the conductive layer acting as the drain of the FET device; and
a source region of the first conductivity type formed in a top portion of the body region adjacent the first trench,
wherein the FET device comprises a channel formed in the body region along the sidewall of the first trench from the source region to a bottom portion of the body region.

2. The field effect transistor (FET) device of claim 1, wherein the conductive spacer comprises a polysilicon spacer and the dielectric layer comprises an oxide layer grown on the polysilicon spacer.

3. The field effect transistor (FET) device of claim 2, wherein the dielectric layer further comprises a nitride layer formed on the grown oxide layer.

4. The field effect transistor (FET) device of claim 1, wherein the conductive layer of a semiconductor material comprises a polysilicon layer having the first conductivity type and being heavily doped, the polysilicon layer being in contact with the exposed semiconductor layer at the bottom portion of the second trench.

5. The field effect transistor (FET) device of claim 1, wherein the semiconductor layer comprises an epitaxial layer of the first conductivity type.

6. The field effect transistor (FET) device of claim 5, further comprising:
a buried layer of the first conductivity type, wherein the epitaxial layer is formed over the buried layer.

7. The field effect transistor (FET) device of claim 1, wherein the semiconductor layer comprises a well of the first conductivity type.

8. The field effect transistor (FET) device of claim 1, wherein the first conductivity type is N-type and the second conductivity type is P-type.

9. The field effect transistor (FET) device of claim 1, wherein the gate dielectric layer comprises a gate oxide layer formed on the sidewall of the first trench.

10. The field effect transistor (FET) device of claim 1, further comprising:
a body contact formed in contact with the body region; and
a source contact formed in contact with the source region.

11. The field effect transistor (FET) device of claim 10, wherein the body contact and the source contact are electrically shorted.

12. A field effect transistor (FET) device, comprising:
a semiconductor layer of a first conductivity type;
a first trench formed in the semiconductor layer, the semiconductor layer being exposed at a bottom portion of the first trench;
a body region of a second conductivity type formed in the semiconductor layer on both sides of the first trench, the body region extending partially the depth of the first trench;
a gate dielectric layer formed on the sidewall of the first trench;
a conductive spacer formed on the sidewall of the first trench and being insulated from the semiconductor layer by the gate dielectric layer, the conductive spacer acting as the gate of the FET device;
a dielectric layer formed over the conductive spacer and insulating the conductive spacer in the first trench;
a conductive layer of a semiconductor material having the first conductivity type and being heavily doped filling the first trench over the dielectric layer, the conductive layer being in contact with the exposed semiconductor layer at the bottom portion of the first trench, the conductive layer acting as the drain of the FET device; and
a source region of the first conductivity type formed in a top portion of the body region adjacent the first trench,
wherein the FET device comprises a channel formed in the body region along the sidewall of the first trench from the source region to a bottom portion of the body region.

13. The field effect transistor (FET) device of claim 12, wherein the conductive spacer comprises a polysilicon spacer and the dielectric layer comprises an oxide layer grown on the polysilicon spacer.

14. The field effect transistor (FET) device of claim 13, wherein the dielectric layer further comprises a nitride layer formed on the grown oxide layer.

15. The field effect transistor (FET) device of claim 12, wherein the conductive layer of a semiconductor material comprises a polysilicon layer having the first conductivity type and being heavily doped, the polysilicon layer being in contact with the exposed semiconductor layer at the bottom portion of the first trench.

16. The field effect transistor (FET) device of claim 12, wherein the semiconductor layer comprises an epitaxial layer of the first conductivity type.

17. The field effect transistor (FET) device of claim 16, further comprising:
a buried layer of the first conductivity type, wherein the epitaxial layer is formed over the buried layer.

18. The field effect transistor (FET) device of claim 12, wherein the semiconductor layer comprises a well of the first conductivity type.

19. The field effect transistor (FET) device of claim 12, wherein the first conductivity type is N-type and the second conductivity type is P-type.

20. The field effect transistor (FET) device of claim 12, wherein the gate dielectric layer comprises a gate oxide layer formed on the sidewall of the first trench.

21. The field effect transistor (FET) device of claim 12, further comprising:
 a body contact formed in contact with the body region; and
 a source contact formed in contact with the source region.

22. The field effect transistor (FET) device of claim 21, wherein the body contact and the source contact are electrically shorted.

\* \* \* \* \*